United States Patent
Arad et al.

(10) Patent No.: US 10,522,388 B1
(45) Date of Patent: Dec. 31, 2019

(54) METHOD OF FORMING HIGH-VOLTAGE SILICON-ON-INSULATOR DEVICE WITH DIODE CONNECTION TO HANDLE LAYER

(71) Applicant: Tower Semiconductor Ltd., Migdal Haemek (IL)

(72) Inventors: Einat Ophir Arad, Migdal Haemek (IL); Sharon Levin, Haifa (IL); Allon Parag, Ramat Ishai (IL); Eran Lipp, Midgal Haemek (IL); Yosef Avrahamov, Migdal Haemek (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 0 days.

(21) Appl. No.: 16/112,466

(22) Filed: Aug. 24, 2018

(51) Int. Cl.
| | |
|---|---|
| *H01L 21/74* | (2006.01) |
| *H01L 27/12* | (2006.01) |
| *H01L 21/84* | (2006.01) |
| *H01L 29/78* | (2006.01) |
| *H01L 29/861* | (2006.01) |
| *H01L 29/06* | (2006.01) |

(52) U.S. Cl.
CPC ............ *H01L 21/74* (2013.01); *H01L 21/84* (2013.01); *H01L 27/1207* (2013.01); *H01L 29/0684* (2013.01); *H01L 29/861* (2013.01); *H01L 29/7818* (2013.01); *H01L 29/7824* (2013.01)

(58) Field of Classification Search
None
See application file for complete search history.

(56) References Cited

U.S. PATENT DOCUMENTS

| | | | |
|---|---|---|---|
| 5,753,560 A | 5/1998 | Hong et al. | |
| 5,777,365 A | 7/1998 | Yamaguchi et al. | |
| 5,874,768 A | 2/1999 | Yamaguchi et al. | |
| 6,958,264 B1 | 10/2005 | Lin | |
| 7,122,395 B2 | 10/2006 | Gogoi | |
| 8,460,976 B2 | 6/2013 | Cheng et al. | |
| 8,828,781 B1 | 9/2014 | Roizin et al. | |
| 9,231,020 B2 | 1/2016 | Veinger et al. | |
| 2007/0048928 A1* | 3/2007 | Johansson | H01L 21/8249 438/234 |
| 2008/0124847 A1* | 5/2008 | Sudo | H01L 21/84 438/152 |

* cited by examiner

*Primary Examiner* — Bo B Jang
(74) *Attorney, Agent, or Firm* — Bever, Hoffman & Harms, LLP

(57) ABSTRACT

An SOI IC includes a polysilicon/silicon plug extending through the buried insulation layer between a P-type handle layer and a P-type device layer. An N-type well region is formed in the device layer over the polysilicon/silicon plug, and then a high-voltage (HV) device is formed in the well region such that part of its drift region is located over the polysilicon/silicon plug. Doping of the well region, the polysilicon/silicon plug and the handle layer is coordinated to form a P-N junction diode that couples the HV device, by way of the polysilicon/silicon plug, to a ground potential applied to the handle layer, thereby increasing the HV device's breakdown voltage by expanding its depletion region to include the handle layer. The polysilicon/silicon plug grows in holes formed through the insulation layer during the epitaxial silicon growth process used to form the device layer.

11 Claims, 8 Drawing Sheets

METHOD OF FORMING HIGH-VOLTAGE SILICON-ON-INSULATOR DEVICE WITH DIODE CONNECTION TO HANDLE LAYER

FIELD OF THE INVENTION

This invention relates to silicon-on-insulator (SOI) integrated circuits (ICs) devices, and more particularly to SOI ICs including high-voltage (HV) devices.

BACKGROUND OF THE INVENTION

The breakdown voltage of HV devices on SOI is limited by the device layer thickness and the buried insulator layer thickness. For example, the drain-substrate voltage of LDMOS transistor in "off" state partly drops on the buried insulator layer and partly on the depleted device layer. The handle layer carries no voltage drop, as it does not meet the conditions for deep depletion formation. Increased breakdown voltage may be achieved by either a thicker device layer (making room for larger depletion region), or a much thinner device layer (increasing the critical electric field, $E_c$, as result of shortened ionization integrating path). The creation of a device layer thicker than a few micrometers, e.g., by epi-Si growth, raises the cost of that layer and complicates considerably the process of trench isolation. In contrast, a device layer thinner than approximately 0.5 μm brings about higher $E_c$; however it rules out the integration of the HV device in a full BCD platform, thus limiting its applicability. Making a thicker buried insulator layer in order to raise BV is limited by process complexity, cost, and worse heat dissipation capability.

Yamaguci et al. (U.S. Pat. No. 5,874,768) insert electric-field alleviating layer of low (intrinsic) concentration or amorphous silicon in bottom portion of the top silicon layer. This creates a PIN diode (body→new layer→drain) that can carry high voltage. Moreover, the intrinsic concentration of the electric-field alleviating layer allows using same layer in both PLDMOS and NLDMOS. This layer allows negative high voltage at source of NLDMOS and vice versa for PLDMOS. The authors achieved a BV of approximately 125V with layer concentration of $1 \times 10^{14}$ cm$^{-3}$ and top silicon layer of thickness 10 μm and buried oxide layer 0.5 μm thick, which is not believed to be optimal.

The thermal conductivity of $SiO_2$, commonly used as the insulating layer in SOI, is about $\frac{1}{100}$ that of Si. Thus a HV device surrounded by insulating layers (lateral buried layer and vertical trenches) is susceptible to buildup of heat and resultant temperature rise. For example, elevated temperature of LDMOS in conduction ("on" state) brings about reduced saturation current due to degraded mobility of carriers. In extreme cases temperature rise may cause thermal destruction. Yamaguchi et al. (U.S. Pat. No. 5,777,365) facilitate heat dissipation by thinning the buried oxide in regions that do not carry high voltage drop, e.g. under body region of an LDMOS. Yamaguchi also considers removing the buried oxide in such low voltage regions, and creating junction isolation instead of dielectric isolation, exclusively for the sake of improved heat dissipation.

Another challenge in processing of a device on SOI is the removal of undesired impurities—usually metal atoms such as copper, nickel, iron, etc.—from device active regions. Such impurities may introduce generation-recombination centers in the energy band gap and affect device performance, depending on their location. These impurities can also degrade gate oxide integrity, increase junction leakage, reduce life-times, etc. Undesired impurity levels in the device layer can be decreased by providing alternative sites ("getters") away from the device active region. These sites are energetically preferable, and may trap impurities that diffuse, e.g. under thermal drive. Getters have to be stable over the entire process, in order to ensure that gettered metal impurities stay remote from active regions. In SOI wafers the buried insulator layer constitutes a diffusion barrier to impurities such as iron; hence effective gettering is required in the device layer.

Hong et al. (U.S. Pat. No. 5,753,560) provide a method for lateral gettering in SOI wafers, to be performed prior to the formation of the gate dielectric layer. With their process, ion implantation amorphizes dedicated regions in the device layer, and subsequent annealing causes recrystallization, leaving defects that form getters. While this method may work well for small devices, where getters can reside close enough to the gate region, it may be less effective for HV devices that usually occupy large areas. A similar gettering technique employs POCl diffusion in SOI HV platform. It consumes large areas due to Phosphorus diffusion, increases the number of process steps and fabrication costs. It is not effective enough, due to the large distance between gettering site and active device location.

Formation of an electrical contact to the handle layer of an SOI wafer is yet another challenge. Grounded backside is a must in HV SOI ICs in order to prevent electric field buildup due to capacitive charge from isolated devices switching. It has proven crucial for proper functionality of, e.g., HV LDMOS in off-state, non-volatile memory cells, etc. Conventionally, creating a handle contact requires a costly process of etching through the top silicon layer (few um thick) and the buried insulating layer. Gogoi (U.S. Pat. No. 7,122,395) makes an electrical contact to the handle layer for MEMS devices on SOI, while keeping the surface planar, by creating an opening through the device layer and into the $SiO_2$ sacrificial layer, followed by epitaxy that covers the opening and forms a planer surface.

What is needed is a low-cost and reliable SOI HV device that exhibits enhanced (higher) breakdown voltage (BV) than that of comparably sized conventionally-fabricated HV devices. What is also needed is a reliable method for producing such SOI HV devices that can be incorporated with minimal changes into an existing SOI fabrication flow.

SUMMARY OF THE INVENTION

The present invention is directed to HV devices formed on SOI substrates in which the silicon volume available for depletion of the HV devices is expanded by way of poly-silicon/silicon plugs that extend through the buried insulator layer between the device layer and the handle layer, and by P-N junction diodes coupled by way of the polysilicon/silicon plugs between the HV devices and a ground potential applied to the handle layer. The polysilicon/silicon plugs are formed in one or more openings (e.g., a single round or square hole, a trench, or a series of round or rectangular holes aligned in the direction orthogonal to the HV device's drain-source, anode/cathode or emitter/base) that are etched through the top silicon layer and the buried insulator layer of the initial SOI substrate to expose corresponding portions of the handle layer's upper surface prior to growing the epitaxial (monocrystalline) silicon (epi-Si) that forms the device layer. Each polysilicon/silicon plug is made up of polycrystalline silicon (polysilicon) that forms on the exposed vertical wall surfaces inside a corresponding opening during initial stages of the epi-Si growth process, and further polysilicon growth and/or epi-Si that fill the remainder of each opening during the epi-Si growth process. Because the polysilicon/silicon plugs contain the same P-type (or N-type) silicon utilized to form the device layer, the as-formed polysilicon/silicon plugs provide electrical bridges that extend through the SOI substrate's insulator layer between the device layer and the handle layer. The P-N junction diodes are generated by way of N-type and P-type diffusions formed in the SOI substrate using doping patterns that produce the required P-N interfaces. N-type or P-type well regions are then formed in the device layer over the polysilicon/silicon plugs, and then the HV devices are partially formed in (i.e., fabricated in and over) the well regions. With this arrangement, the P-N junction diodes operably connect the well regions to a ground potential applied to a lower surface of the handle layer during operation, whereby the P-N junction diodes function to increase the breakdown voltage (BV) of the HV devices by extending the voltage blocking capability of the HV devices to the handle layer when the HV devices are in an "off" state. Accordingly, the present invention provides SOI HV devices that exhibit enhanced (higher) BV than the BV of comparably sized conventionally-fabricated HV devices by utilizing polysilicon/silicon plugs and associated doping configurations to effectively increase the silicon volume available for depletion of the HV devices when under reverse bias. In addition, by enabling the use of the handle layer to effectively increase the silicon volume available for depletion, the present invention facilitates the fabrication of SOI HV devices using a thinner device layer, thereby simplifying and reducing manufacturing costs.

According to a preferred embodiment of the present invention, the ability of the P-N junction diodes (mentioned above) to increase the breakdown voltage of SOI HV devices is enhanced by way of positioning the polysilicon/silicon plug below the HV device's drift region, which is disposed between the HV device's source/drain, anode/cathode or collector/emitter regions. That is, achieve a significant BV increase, the HV device is preferably fabricated in and over a corresponding well region such that its first (e.g., source/anode/collector) region and its second (e.g., drain/cathode/emitter) region are laterally (horizontally) disposed on opposite sides of the underlying polysilicon/silicon plug, whereby the polysilicon/silicon plug is at least partially disposed under the HV device's drift region. The optimal lateral location of the polysilicon/silicon plug relative to the HV device depends on the potential drop distribution along the drift region, which is dictated by parameters such as the doping profiles of the wells, the length of the drift region, the extension of field plates, etc. However, it is currently believed that HV devices that exploit the entire device layer for vertical depletion may achieve enhanced BV characteristics by way of utilizing the P-N junction diodes of the present invention with polysilicon/silicon plugs positioning at an appropriate point between the first (e.g., source) and second (e.g., drain) regions.

According to another embodiment, the present invention provides a method for fabricating SOI HV devices including etching the top silicon layer and the insulator layer of an initial SOI substrate to define openings that expose corresponding upper surface portions of the underlying handle layer, forming a device layer by growing epitaxial silicon over the top silicon layer, forming well regions in the device layer, and forming HV devices in the well regions. When epitaxial silicon growth is initiated during formation of the device layer, at least one of polysilicon and epitaxial (monocrystalline) silicon form inside the openings while epitaxial silicon forms over the top silicon layer around the openings, whereby the polysilicon and/or epitaxial silicon eventually fill the openings to form the polysilicon/silicon plugs, which are then buried under the subsequently grown epitaxial silicon that forms the completed device layer. Note that the polysilicon/silicon plugs form electrical connections between the handle layer and the device layer because (a) both the device layer and the polysilicon/silicon plugs have the same dopant species and dopant concentration (i.e., both are formed using the same N-type or P-type silicon used to form the device layer), and (b) the lower ends of the polysilicon/silicon plugs abut the upper surface of the handle layer, which is typically doped with the same species as that of the device layer. The well regions are then formed in the device layer over the polysilicon/silicon plugs by implanting a well dopant having an opposite species type to that of the device layer, thereby forming P-N junction diodes extending between the handle layer and the well regions. Because the above-described method requires minimal changes to SOI fabrication flows (processes), the present invention provides a reliable method for producing SOI HV devices that exhibit enhanced (higher) BV than that of comparable conventionally-fabricated HV devices by way of providing polysilicon/silicon plugs and associated doping configurations to form P-N junction diodes that effectively increase the silicon volume available for depletion of the HV devices when under reverse bias. Moreover, the present invention may be implemented in an existing SOI process flow at minimal additional cost because the polysilicon/silicon plugs are formed before growing the SOI device layer (i.e., the polysilicon/silicon plugs have minimal effect on the thermal budget of the subsequently performed SOI fabrication flow and are fabricated on top of thin device layer which simplifies process integration), because the plugs may be produced using minimal additional process steps (e.g., using a single mask/etch process), and because the doping configurations required to form the P-N junction diodes can be implemented with minimal changes to an existing SOI fabrication flow. According to alternative exemplary embodiments, various doping configurations are utilized to form P-N junction diodes such that their associated P-N junctions are formed in the device layer, by way of a well dopant diffused into the polysilicon/silicon plugs, by way of a well dopant diffused through the polysilicon/silicon plugs and into the handle layer, or by way of a plug implant formed in the handle layer before formation of the polysilicon/silicon plugs. These exemplary embodiments illustrate how various doping configurations may be utilized to efficiently produce optimal diode characteristics for a given HV device or for a given SOI fabrication flow.

Although the present invention is primarily described with reference to the fabrication of SOI NMOS HV devices, the appended claims should not be limited to the exemplary embodiments unless otherwise specified. For example, SOI PMOS HV devices that are coupled by way of P-N junction diodes to the handle layer in the manner described with reference to the specific embodiments described above may be implemented by way of forming P-drift regions inside the above-mentioned N-well regions, and then forming PMOS HV devices that utilize the P-drift regions. In another example, the doping schemes described above may be reversed (i.e., where the handle layer, the top silicon layer and the device layer all comprise N-doped silicon, and the well region comprises P-doped silicon), with the HV device formed in the P-well region being a PMOS device.

Moreover, although the invention is described with specific reference to LDMOS-type HV devices, the present invention may be utilized to form other HV devices as well (e.g., HV diodes, HV ESD devices, and HV bipolar transistors).

The polysilicon/silicon plugs described herein may be utilized to provide additional benefits to SOI ICs produced in accordance with the present invention. For example, in addition to being utilized to form P-N junction diodes below HV devices, one or more polysilicon/silicon plugs may be utilized to form additional beneficial electrical paths between selected device layer portions and the handle layer in portions of the SOI IC that do not include HV devices (e.g., to facilitate maintaining the handle layer at the ground potential using a front-side connection, which reduces assembly costs in comparison to back-side ground connections). In addition, polysilicon/silicon plugs may serve as gettering sites for metal impurities that would otherwise reside in the device layer, and would degrade performance of HV or other devices. Polysilicon/silicon plugs may also serve to dissipate heat generated by high-heat-generating devices by conducting the heat from associated device layer portions to a heat sink attached to the handle layer. Because polysilicon/silicon plugs designated for these additional beneficial functions may be formed simultaneously with the polysilicon/silicon plugs specifically provided to increase the BV of HV devices, these additional benefits are achieved with no additional production cost.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention relates to an improvement in SOI HV devices. The following description is presented to enable one of ordinary skill in the art to make and use the invention as provided in the context of a particular application and its requirements. As used herein, directional terms such as "upper", "lower" and "downward" are intended to provide relative positions for purposes of description, and are not intended to designate an absolute frame of reference. The terms "coupled" and "connected", which are utilized herein, are defined as follows. The term "connected" is used to describe a direct connection between two circuit elements, for example, by way of a metal line formed in accordance with normal integrated circuit fabrication techniques. In contrast, the term "coupled" is used to describe either a direct connection or an indirect connection between two circuit elements. For example, two coupled elements may be directly connected by way of a metal line, or indirectly connected by way of an intervening circuit element (e.g., a capacitor, resistor, inductor, or by way of the source/drain terminals of an NMOS or PMOS transistor). Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
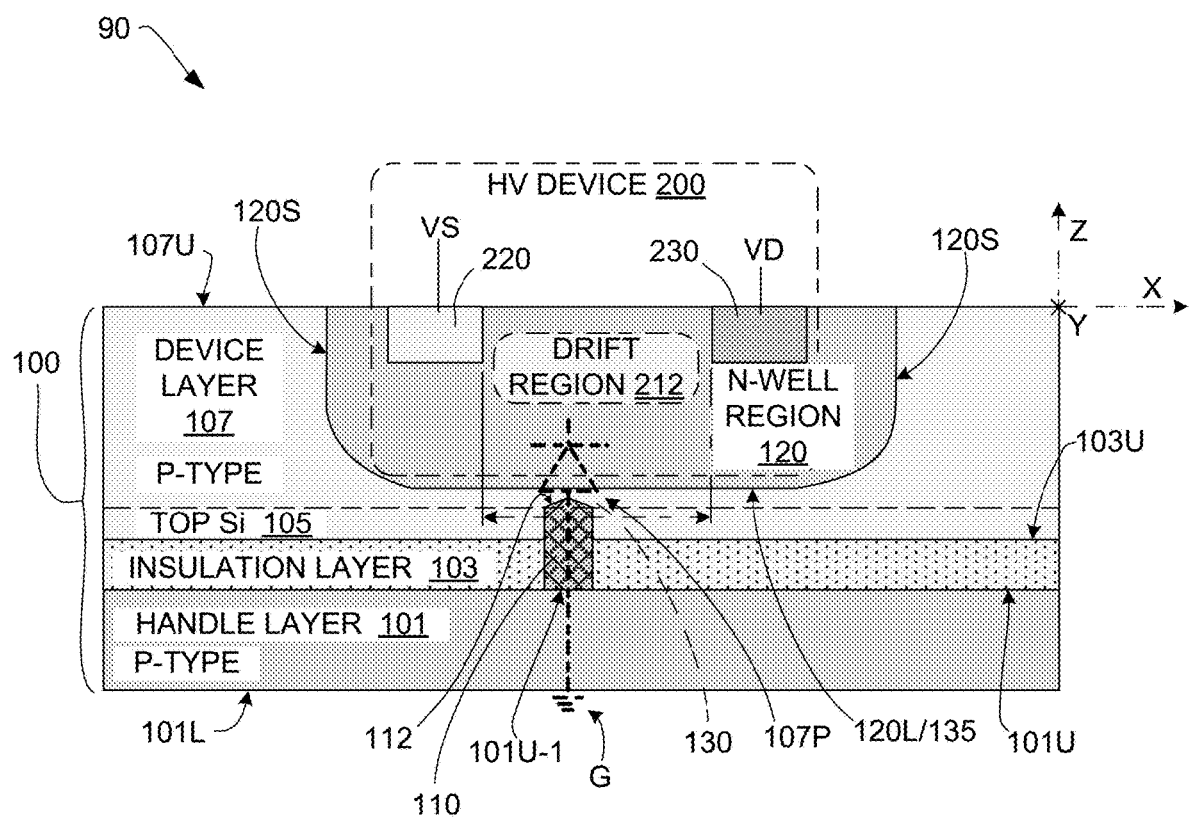
FIG. 1 is a cross-sectional side view showing a simplified HV device formed on an SOI substrate according to an embodiment of the present invention.

FIG. 1 depicts a portion of a simplified SOI IC (integrated circuit device) 90 including an HV device 200 formed on an SOI substrate 100 according to a simplified exemplary embodiment of the present invention. HV device 200 is described below using exemplary device structures and implants that are consistent with HV NMOS transistors formed on a p-type SOI substrate, but may be implemented using other HV device types (e.g., HV diodes, HV bipolar transistors, or HV PMOS transistors). The specific shapes and sizes of the various exemplary device structures and implants that collectively form HV device 200 are depicted in a simplified manner for descriptive purposes and are not necessarily drawn to scale, and those skilled in the art will recognize that the associated structures/implants may be implemented using other configurations without departing from the spirit and scope of the present invention (e.g., P-type implants may be included inside or below an HV device's N-well region to improve the resurf effect).

SOI substrate 100 includes an insulation layer 103 sandwiched between a P-type handle layer 101 and at least one of a P-type top silicon layer 105 and a P-type epitaxial silicon device layer 107. Handle layer 101, top silicon layer 105 and device layer 107 are monocrystalline silicon, with top silicon layer 105 typically formed on upper surface 103U of insulation layer 103 by an SOI wafer manufacturer, whereas top silicon layer 105 is utilized as a "seed layer" during formation of device layer 107 at the beginning of a SOI fabrication flow used to fabrication HV device 200 (and other devices) on SOI substrate 100. That is, device layer 107 is typically formed over top silicon layer 105 using known epitaxial silicon processing techniques as part of the fabrication process utilized to form SOI IC 90, whereby top silicon layer 105 essentially becomes a lower part of device layer 107. According to an aspect of the invention, handle layer 101, top silicon layer 105 and device layer 107 are formed with the same (first) doping species type (i.e., either N-type doping or P-type doping). For example, each of handle layer 101, top silicon layer 105 and device layer 107 depicted in the exemplary embodiment shown in FIG. 1 includes P-type doping. In other embodiments, all three layers may comprise N-type doping. As is understood by those skilled in the art and defined herein, a semiconductor structure referred to herein as "P-type", "P-doped" or as having "P-type doping" has electrical properties that are predominantly modulated by P-type dopants (e.g., Boron and Gallium) diffused therein, and a semiconductor structure referred to herein as "N-type", "N-doped" or having an "N-type doping" has electrical properties that are predominantly modulated by N-type dopants (e.g., Phosphorous and Arsenic).

In the exemplary embodiment depicted in FIG. 1, HV device 200 is configured in a manner similar to that of an NMOS transistor including a N-type source region 220 and a N-type drain region 230 formed in spaced-apart arrangement in an N-well region 120, and includes a lightly N-doped drift region 212 disposed inside N-well region 120 and between source region 220 and drain region 230. N-well region 120 is an N-type region formed in device layer 107 having an upper boundary defined by a corresponding section of upper surface 107U, side (vertical) boundaries 120S that extend downward (e.g., in X-Z and Y-Z planes in FIG. 1) from upper surface 107U, and a lower boundary 120L that is generally horizontal to an X-Y plane (i.e., roughly parallel to upper surface 107U). Both side boundaries 120S and lower boundary 120L are electrically isolated by corresponding portions of P-type device layer 107 (i.e., the boundaries form P/N junction isolation). In some embodiments (described below), electrical isolation of a well-type region's lower boundary is provided by upper surface of insulation layer 103 (i.e., dielectric isolation). Drift region 212 includes a light N-type doping (e.g., in the range between $2 \times 10^{12}$ and $4 \times 10^{12}$ atoms/cm$^2$) that is determined by the dose of N-well implant 120. Source and drain regions 220 and 230 are N-type diffusions formed in device layer 107 having an upper boundaries defined by corresponding sections of upper surface 107U, and having respective side and lower boundaries. HV device 200 is understood to include other necessary structures configured for HV circuit operations (e.g., in the case of NMOS transistors, the various features described below with reference to FIG. 7). In addition, although regions 220 and 230 are referred to herein as "source" and "drain" regions for brevity, it is understood that in other embodiments regions 220 and 230 may be referred to "collector" and "emitter" (e.g., in the case of HV bipolar transistors), or "anode" and "cathode" (e.g., in the case of HV diodes).

According to an aspect of the present invention, a polysilicon/silicon plug 110 extends through insulation layer 103 between handle layer 101 and the device layer 107, and is located laterally (i.e., in the X-axis direction indicated in FIG. 1) between source region 220 and drain region 230 (i.e., at least partially below drift region 212 of HV device 200). As explained below, polysilicon/silicon plug 110 comprises at least one of polysilicon and epitaxial (monocrystalline) silicon that is formed during the epitaxial silicon growth process utilized to form device layer 107, and in one embodiment include the same P-type dopant that is present in device layer 107. Because polysilicon/silicon plug 110 comprises the same P-type dopant that is present in device layer 107, and because a lower end of polysilicon/silicon plug 110 abuts region 101U-1 of an upper surface 101U of handle layer 101, polysilicon/silicon plug 110 forms an electrically conductive pathway (electrical bridge) that extend through insulator layer 103 between device layer 107 and handle layer 101.

According to another aspect of the present invention, doping patterns formed in at least one of handle layer 101, polysilicon/silicon plug 110 and device layer 107 are operably configured such that a P-N junction diode 130 is effectively formed between N-well region 120 and a ground potential G, which is applied to lower surface 101L of handle layer 101 during operation of SOI IC 90. In the embodiment shown in FIG. 1, P-N junction diode 130 is formed by a P-N junction 135 defined by the interface between lower boundary 120L of N-well region 120 and the underlying P-doped portion 107P of device layer 107 (i.e., P-N junction diode 130 is formed between HV device 200 and an upper end surface 112 of polysilicon/silicon plug 110), where P-doped portion 107P is electrically connected to ground potential G by way of plug 110 and handle layer 101. Accordingly, P-N junction diode 130 is configured such that, when HV device 200 is in an "off" operating state, P-N junction diode 130 functions to effectively extend the voltage blocking capability of HV device 200 to handle layer 101. That is, when a gate voltage applied to a gate structure (not shown) of HV device 200 is below a threshold voltage of HV device 200 while a suitable high (positive) drain voltage VD is applied to drain region 230 and a source signal VS applied to source region 220 equals 0V (ground), P-N junction diode 130 couples HV device 200 to ground potential G by way of polysilicon/silicon plug 110, thereby increasing the breakdown voltage of HV device 200 by expanding its depletion region to include handle layer 101. Accordingly, the present invention provides a simple and reliable method for producing SOI HV devices that exhibit enhanced (higher) BV than that of comparable conventionally-fabricated HV devices on SOI, by utilizing polysilicon/silicon plugs 110 and associated doping configurations to form P-N junction diodes 130 that effectively increase the silicon volume available for depletion of HV devices 200 when under reverse bias.

According to a preferred embodiment of the present invention, the ability of P-N junction diodes 130 to increase the BV of SOI HV device 200 is enhanced by way of positioning the polysilicon/silicon plug below drift region 212, which is disposed between source region 220 and drain region 230. For example, in LDMOS under reverse bias, considerable portion of voltage is vertically dropped on the insulating layer in the vicinity of the drain contact. Creating a plug directly under the drain contact may have no benefit in situations where handle and device layer resistivity and thicknesses are given (i.e., fixed by an established SOI fabrication process), because the handle layer will substitute the buried oxide in carrying about the same voltage drop. Likewise, if a plug is located in the vicinity of the body region, where normally the oxide layer does not carry any voltage drop, the device will not withstand higher voltage. Therefore, to achieve a significant BV increase, HV device 200 is preferably fabricated in and over well region 120 such that source region 220 and drain region 230 are laterally (horizontally in the X-axis direction) disposed on opposite sides of underlying polysilicon/silicon plug 110 (e.g., as indicated in FIG. 1 by the dashed-line arrows extending to the sides of polysilicon/silicon plug 110), whereby polysilicon/silicon plug 110 is at least partially disposed under drift region 212. The optimal lateral location of the polysilicon/silicon plug relative to source region 220 and drain region 230 (i.e., closer to source region 220, as depicted, or closer to drain region 230) depends on the potential drop distribution along drift region 212, which is dictated by parameters such as the doping profiles, the length of the drift region, and the extension of field plates associated with the fabrication of HV device 200.

FIGS. 2A to 2F depict a method for fabricating a single HV device on a SOI wafer (substrate) according to an exemplary embodiment of the present invention. In practical embodiments the processes described below are performed simultaneously in multiple sections of the SOI wafer that are similar to those depicted in FIGS. 2A to 2F.

Figure 2A:
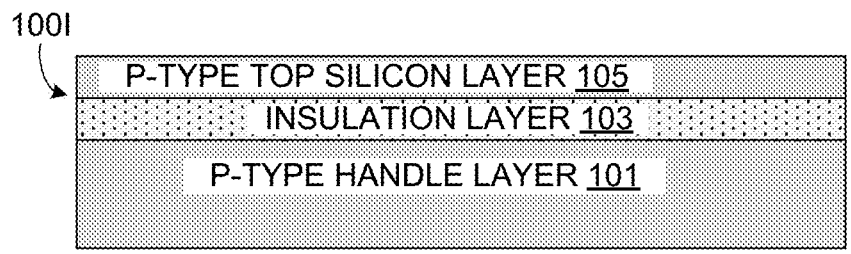
FIGS. 2A, 2B, 2C, 2D, 2E and 2F are cross-sectional side views showing various fabrication stages utilized to fabricate a polysilicon/silicon plug according to another embodiment of the present invention.

FIG. 2A depicts a SOI substrate 100I in an initial state prior to starting the fabrication method (i.e., SOI substrate 100I is configured in a typical manner received by a fabrication facility from an SOI substrate manufacturer). Initial SOI substrate 100I includes an insulation layer 103 sandwiched between a handle layer 101 and a thin top silicon layer 105. Both handle layer 101 and top silicon layer 105 have the same (first) doping species type (e.g., both 101 and 105 are P-type in the present example, but can be N-type in other embodiments).

Figure 2B:
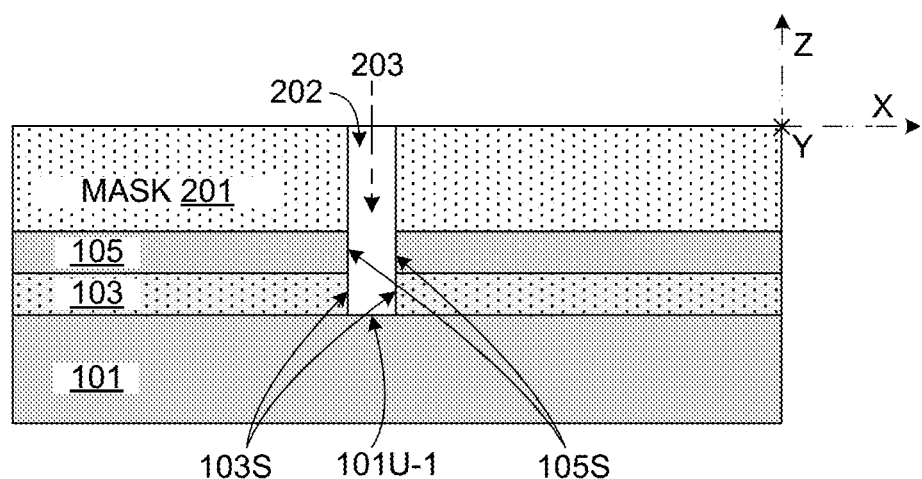

FIG. 2B shows a first phase of the method includes utilizing a patterned resist mask 201 and a suitable etchant 203 to etch through a portion of top silicon layer 105 and an underlying portion of insulator layer 103 to define an opening 202 that exposes a corresponding upper surface portions 101U-1 of the underlying handle layer 101. After etching is complete, opening 202 is characterized as an air/gas filled region defined by vertical side walls 105S of top silicon layer 105 and vertical side walls 103S of insulator layer 103. In alternative embodiments, opening 202 may include a single round or square hole, a trench extending in the Y-axis direction (i.e., perpendicular to the X-Z plane containing the figure), or a series of round or rectangular holes aligned in the Y-axis direction (i.e., orthogonal to subsequently formed drain and source regions). Mask 201 is removed after the etching process is complete using known techniques.

Figure 2C:
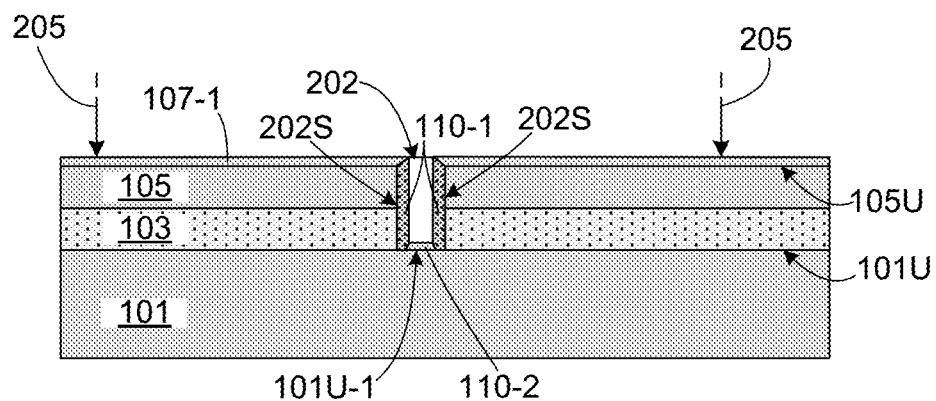
Figure 2D:
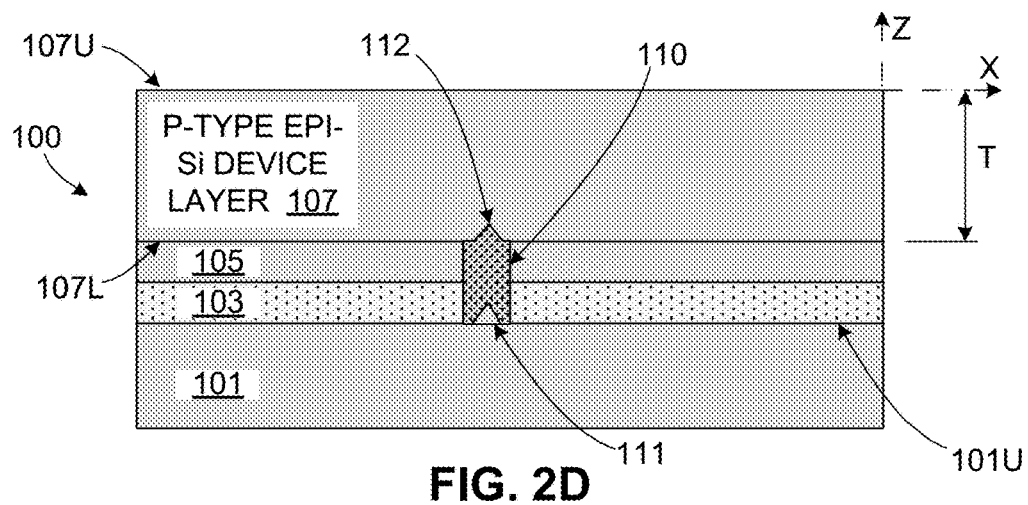

FIGS. 2C and 2D depict the subsequent formation of device layer 107 over top silicon layer 105 by way of growing P-doped epitaxial silicon using known techniques (e.g., vapor-phase epitaxy (VPE)), where layout optimization of resist mask 201 and tuning of the P-doped epitaxial silicon growth process are combined to effectively fill the plug opening, and to form monocrystalline silicon over the plug opening such that device layer 107 has a flat upper surface for supporting subsequent processes.

FIG. 2C depicts an early stage of the epitaxial silicon growth process, soon after the deposition of P-doped silicon 205 on initial SOI has started. As is understood in the art, top silicon layer 105 acts as a seed crystal for initial epitaxial silicon growth, whereby a thin monocrystalline silicon initial epitaxial layer 107-1 begins to grow on upper surface 105U of top silicon layer 105. According to an aspect of the invention, during the formation of initial epitaxial layer 107-1, P-doped silicon 205 causes the simultaneous formation of at least one of P-doped polysilicon 110-1 and monocrystalline silicon 110-2 on the vertical and horizontal surfaces disposed inside opening 202. In the exemplary embodiment depicted in FIG. 2C, polysilicon 110-1 is depicted as being grown or otherwise formed on vertical side walls 202S of opening 202 (i.e., one or both of side walls 105S and 103S, both indicated in FIG. 2B), and monocrystalline silicon 110-2 is grown or otherwise formed on exposed section 101U-1 of upper handle layer surface 101U. In other embodiments, only P-doped polysilicon 110-1 forms on the vertical and horizontal surfaces of opening 202, or P-doped polysilicon 110-1 forms only on a portion of the vertical surfaces inside opening 202 (e.g., only on the exposed side surfaces of insulation layer 103). The actual relationship between polycrystalline and monocrystalline silicon in the plug can be tuned by surface preparation, epi conditions and the shape of opening 202 in plug mask 201.

FIG. 2D depicts SOI substrate 100 after the epitaxial silicon growth process mentioned above is completed, whereby formation of device layer 107 having a desired thickness T (e.g., in the range of 3 µm and 10 µm) is completed. During the epitaxial silicon growth process, the opening (i.e., opening 202, shown in FIGS. 2B and 2C) is entirely filled by polysilicon and/or monocrystalline silicon, thereby forming polysilicon/silicon plug 110, which is then overgrown by (buried under) the subsequently grown epitaxial silicon that forms device layer 107. Note that polysilicon/silicon plug 110 passes through top silicon layer 105 and insulation layer 103 between handle layer 101 and device layer 107. Note also that polysilicon/silicon plug 110 forms an electrical connection (i.e., electrically conductive pathway) between handle layer 101 and device layer because (a) handle layer 101, device layer 107 and polysilicon/silicon plug 110 are formed by P-doped silicon, and (b) the lower end 111 of polysilicon/silicon plug 110 abuts upper surface 101U of handle layer 101.

Figure 2E:
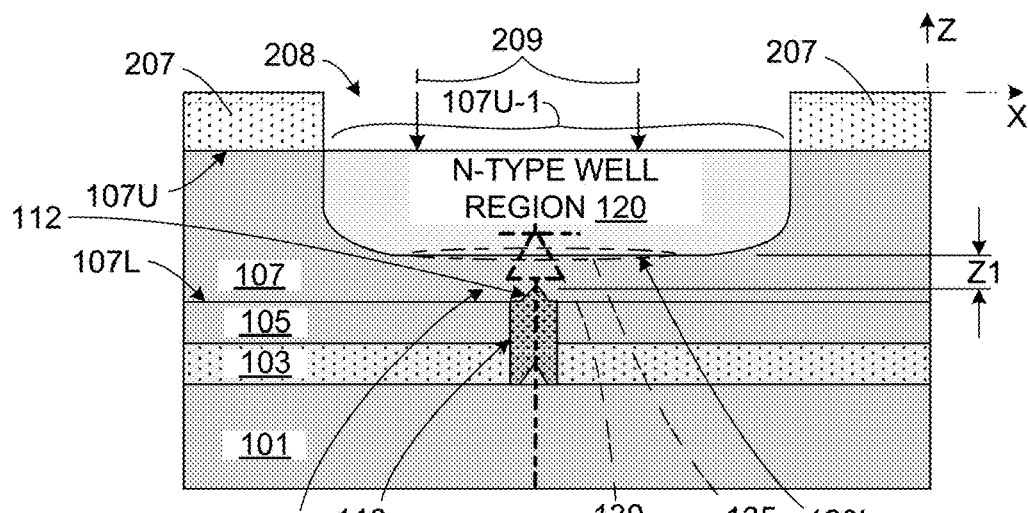

FIG. 2E depicts the subsequent formation of well region 120 in a region of device layer 107 located over polysilicon/silicon plug 110. In the exemplary embodiment, a suitable mask 207 is formed by depositing a resist material on upper surface 107U of device layer 107, and then patterning the resist layer to define an opening 208 that exposes a region 107U-1 of upper surface 107U that is located over polysilicon/silicon plug 110. An N-type well dopant 209 is then operably implanted through opening 208 and exposed region 107U-1 into device layer 107. In the exemplary embodiment, the N-implant process is performed such that a nominal lower boundary 120L of well region 120, which is defined by a nominal diffusion depth achieved by well dopant 209, is disposed inside device layer 107 (i.e., between upper surface 107U and lower surface 107L), and more specifically such that lower boundary 120L is vertically located above an upper end surface 112 of polysilicon/silicon plug 110 (i.e., a nominal vertical distance Z1 between upper end surface 112 and lower boundary 120L is greater than zero). As set forth above, a P-N junction 135 is formed by the interface region between nominal lower boundary 120L of N-well region 120 and the underlying P-doped epitaxial silicon portion 107P. The combination of P-N junction 135 and polysilicon/silicon plug 110, which provides a conductive pathway from the underlying P-doped portion 107P to lower surface 101L of handle layer 101, effectively forms a P-N junction diode 130 between N-well region 120 and lower surface 101L.

Figure 2F:
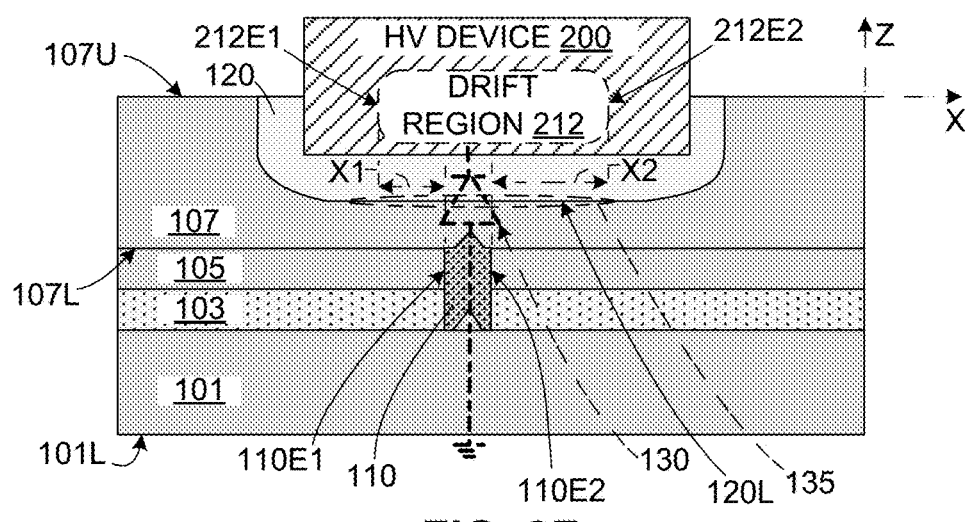

FIG. 2F depicts the subsequent fabrication of HV device 200 in well region 120 over polysilicon/silicon plug 110 using known techniques such that a drift region 212 is at least partially formed over polysilicon/silicon plug 110. In the exemplary embodiment, HV device 200 is fabricated such that polysilicon/silicon plug 110 is entirely located under drift region 212 (i.e., side edge 110E1 of plug 110 is spaced a distance X1 from nominal side boundary 212E1 of drift region 212, and side edge 110E2 of plug 110 is spaced a distance X2 from nominal side boundary 212E2 of drift region 212). As indicated at the bottom of FIG. 2F, the above-described method is further modified by way of configuring lower surface 101L of handle layer 101 to support a ground potential G during operation of HV device 200. Accordingly, the above-described method facilitates the fabrication of HV device 200 exhibiting enhanced BV during operation by way of P-N junction diode 130, which effectively increases the silicon volume available for depletion of HV device 200 when under reverse bias. Moreover, the present invention may be implemented in an existing SOI process flow at minimal additional cost because, as described above with reference to FIGS. 2A to 2D, polysilicon/silicon plugs 110 are formed before growing device layer 107 (i.e., the provision of polysilicon/silicon plugs 110 has minimal effect on the thermal budget of the subsequently performed SOI fabrication flow, and are fabricated on top of thin device layer which simplifies process integration), because the plugs may be produced using minimal additional process steps (e.g., using a single mask/etch process), and because the doping configurations required to form the P-N junction diodes can be implemented with minimal changes to an existing SOI fabrication flow.

FIGS. 3A to 5C present alternative exemplary embodiments of the present invention in which various doping configurations are utilized to form P-N junctions in portions of an SOI substrate other than those described above. That is, as set forth above with reference to FIGS. 1 and 2E, P-N junction 135 is depicted as being formed inside device layer 107 by way forming P-type polysilicon/silicon plugs 110 and P-type device layer 107 over P-type handle layer 101, and implanting an N-type well dopant 209 in device layer 107 such that lower boundary 120L of N-type well region 120 is disposed entirely inside P-type device layer 107 (i.e., such that the lower well boundaries 120L are vertically separated from upper end surface 112 of polysilicon/silicon plug 110 by p-doped region 107P of device layer 107). As set forth below, alternative doping configurations are utilized to form P-N junction diode structures such that their associated P-N junctions are located either inside the polysilicon/silicon plug or inside the handle layer 101.

Figure 3A:
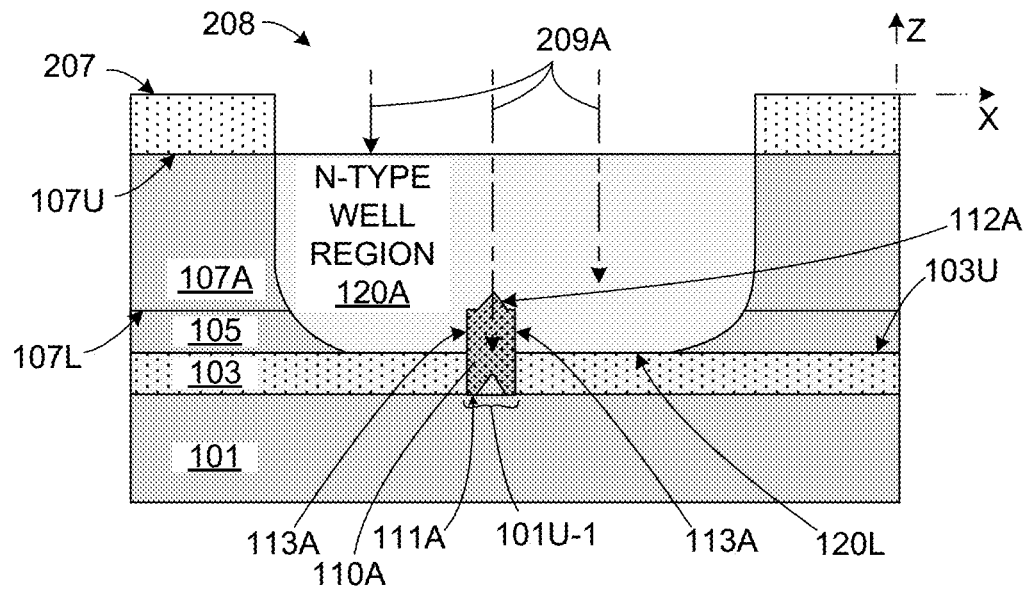
FIGS. 3A and 3B are cross-sectional side views showing generalized fabrication processes utilized to form an HV device having enhanced BV characteristics according to an alternative embodiment of the present invention.
Figure 3B:
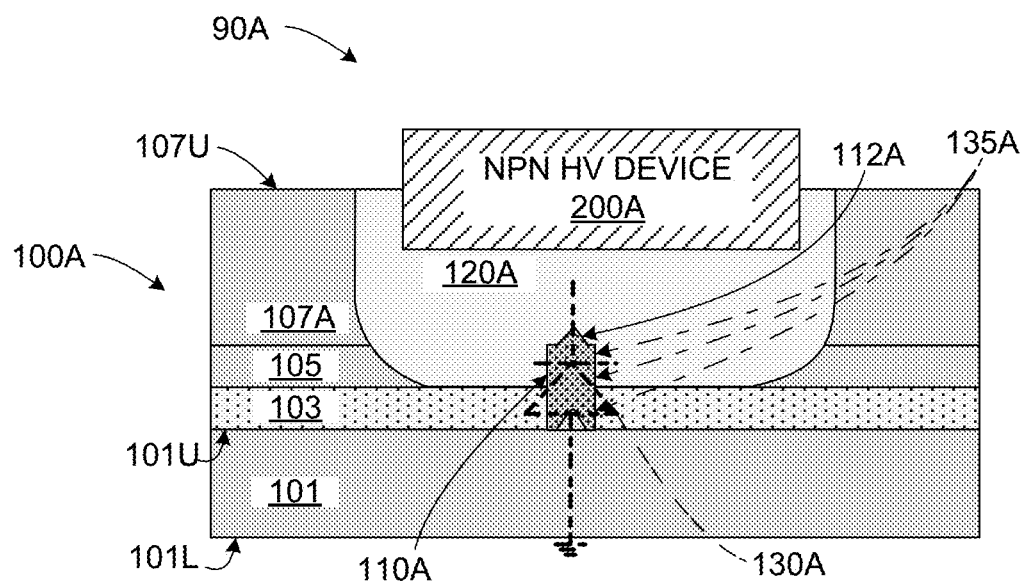

3A and 3B depict an alternative exemplary embodiment in which P-N junctions are formed inside the polysilicon/silicon plugs. Referring to FIG. 3A, P-type polysilicon/silicon plug 110A and P-type device layer 107A are substantially the same as described above with reference to FIGS. 2A to 2D, whereby SOI substrate 100A is initially identical to SOI substrate 100 (described above with reference to FIG. 2D). In addition, a mask 207 is formed on upper surface 107U and a well dopant 209A is then implanted through opening 208 and the exposed portion of upper surface 107U to form an N-well region 120A in a manner similar to that described above with reference to FIG. 2E. The doping configuration of SOI substrate 100A differs from the previous embodiment in that the parameters utilized during the N-well implant are set such that lower boundary 120L of N-well region 120A is vertically positioned below upper end surface 112A of polysilicon/silicon plug 110A (e.g., lower boundary 120L extends entirely between upper surface 107U and lower surface 107L of device layer 107A, and coincides with upper surface 103U of insulation layer 103). It is assumed for exemplary purposes that the N-well implant parameters are set such that a portion of well dopant 209A diffuses into at least a portion of polysilicon/silicon plug 110A, whereby a P-N interface 135A is formed that is located between upper end surface 112A of polysilicon/silicon plug 110A and upper surface portion 101U-1 of handle layer 101. For example, assuming the portion of well dopant 209A diffuses the entire length of polysilicon/silicon plug 110A but does not enter handle layer 101, then P-N interface 135A would be formed near an interface between lower end surface 111A of polysilicon/silicon plug 110A and upper surface portion 101U-1 of handle layer 101. If well dopant 209A diffuses only part of the way along polysilicon/silicon plug 110A, then the P-N junction would be located inside polysilicon/silicon plug 110A between lower end surface 111A and upper end surface 112A. As indicated in FIG. 3B, HV device 200A is then formed in and over N-well region 120A in a manner similar to that described above with reference to FIG. 2F, and a ground potential is applied to lower surface 101L of handle layer 101 during subsequent operation of SOI IC 90A. By controlling the well doping process such that significant diffusion of well dopant 209A is terminated inside polysilicon/silicon plug 110A, P-N interface 135A is formed at an associated location along the length of polysilicon/silicon plug 110A, whereby a P-N junction diode 130A is effectively formed inside polysilicon/silicon plug 110A. Three exemplary alternative locations of P-N interface 135A along the length of polysilicon/silicon plug 110A are indicated by the multiple dot-lined arrows in FIG. 3B.

Figure 4A:
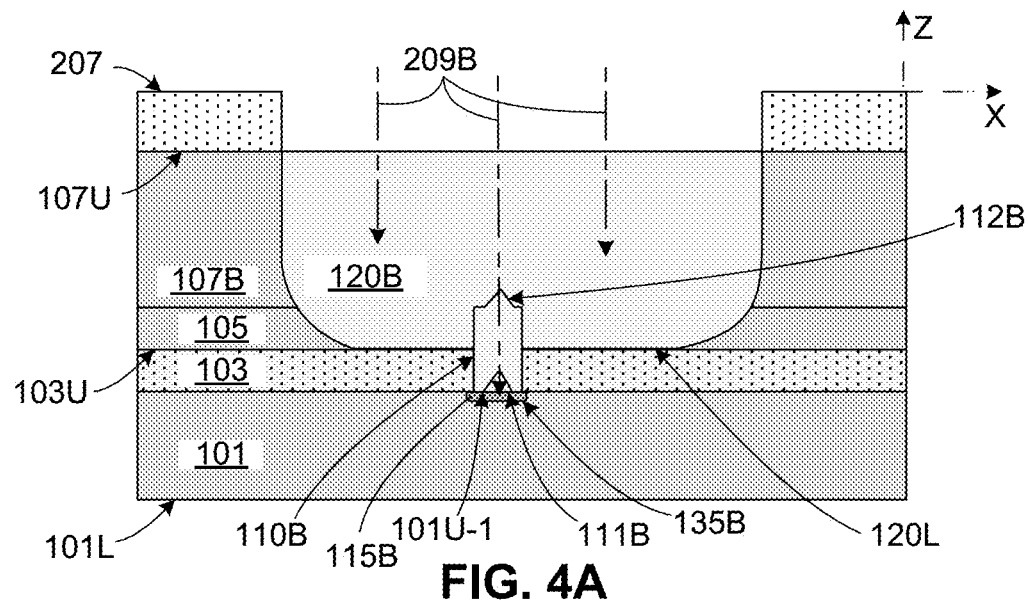
FIGS. 4A and 4B are cross-sectional side views showing another method for fabricating another SOI IC including HV devices having enhanced BV characteristics according to another embodiment of the present invention.
Figure 4B:
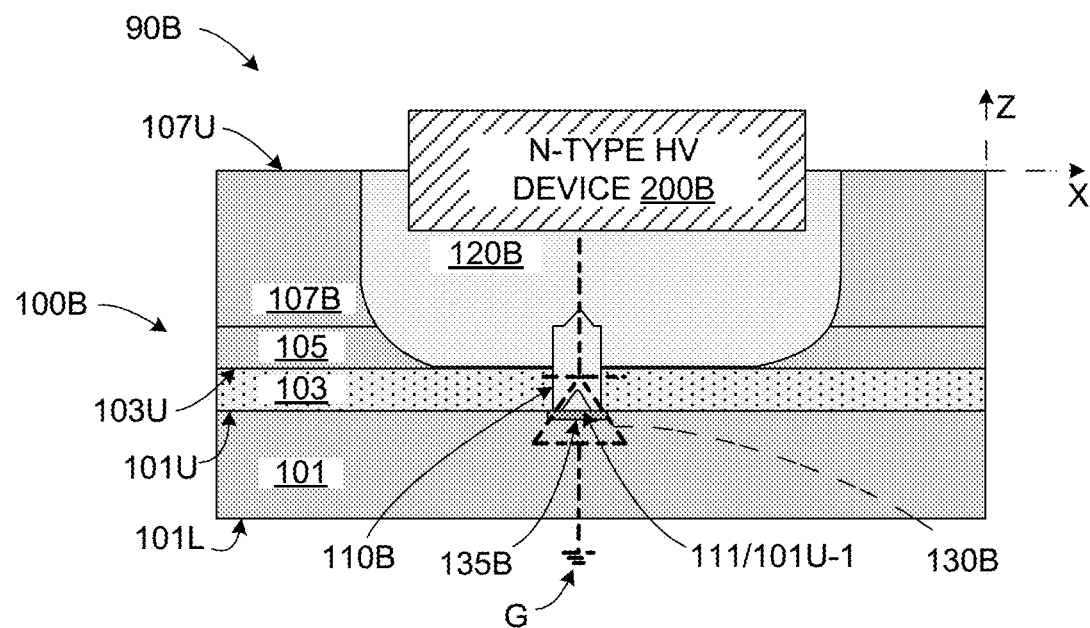

FIGS. 4A and 4B depict another alternative exemplary embodiment in which a P-N junction is formed between the lower end surface of the polysilicon/silicon plugs and the lower surface of the handle layer (e.g., inside the handle layer). Referring to FIG. 4A, P-type polysilicon/silicon plug 110B and P-type device layer 107B are substantially the same as described above with reference to FIGS. 2A to 2D, whereby SOI substrate 100B is initially identical to SOI substrate 100 (described above with reference to FIG. 2D). In addition, mask 207 is formed on upper surface 107U and a well dopant 209B is then implanted through the exposed portion of upper surface 107U to form an N-well region 120B in a manner similar to that described above with reference to FIGS. 2E and 3A. The doping configuration of SOI substrate 100B is similar to the previous embodiment in that the parameters utilized during the N-well implant are set such that lower boundary 120L of N-well region 120B coincides with upper surface 103U of insulation layer 103, but differs in that the N-well implant parameters are set such that a portion of well dopant 209B diffuses along the entire length (i.e., entirely through) polysilicon/silicon plug 110B and forms a diffusion region 115B inside handle layer 101 that is located below upper surface portion 101U-1, whereby a P-N interface 135B is formed by a boundary of diffusion region 115B between lower end surface 111B of polysilicon/silicon plug 110B and lower surface 101L of said handle layer 101. As indicated in FIG. 4B, HV device 200B is then formed in and over N-well region 120B in a manner similar to that described above with reference to FIG. 2F, and a ground potential is applied to lower surface 101L of handle layer 101 during subsequent operation of SOI IC 90B. With this configuration, a P-N junction diode 130B is formed by way of P-N interface 135B located inside handle layer 101 adjacent to lower end surface 111B of polysilicon/silicon plug 110B, and P-N junction diode 130B is coupled between said HV device 200 and lower surface 101L of handle layer 101 by way of polysilicon/silicon plug 110B and handle layer 101.

Figure 5A:
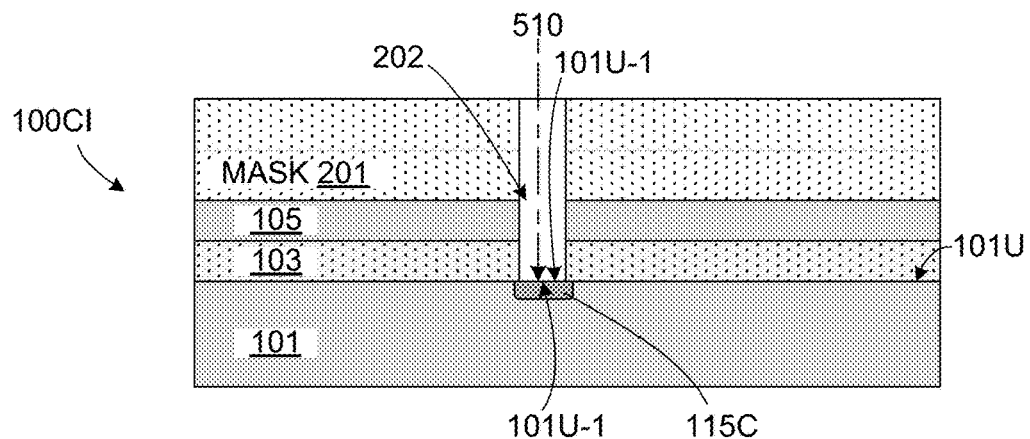
FIGS. 5A, 5B and 5C are cross-sectional side views showing yet another method for fabricating another SOI IC including HV devices having enhanced BV characteristics according to another embodiment of the present invention.
Figure 5B:
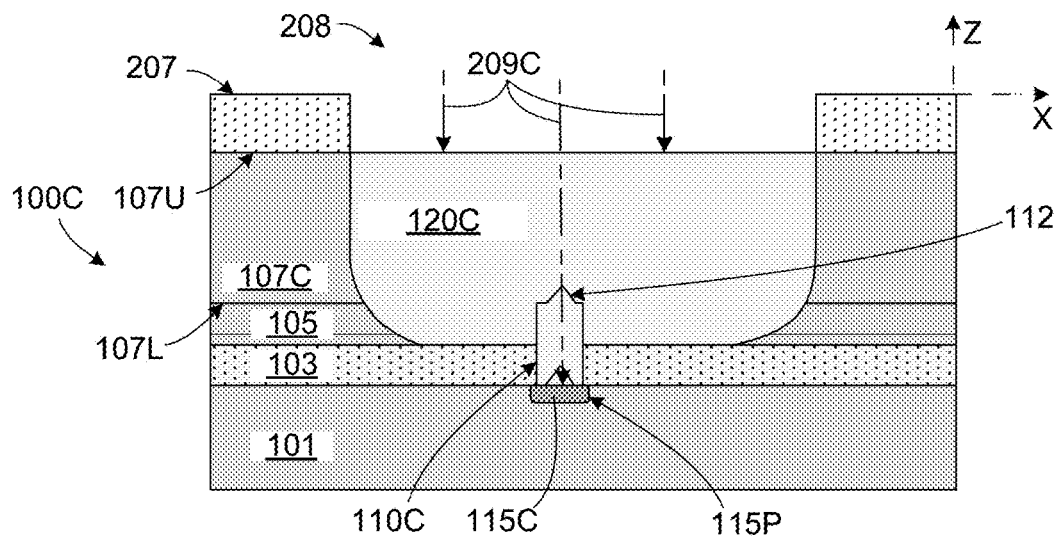
Figure 5C:
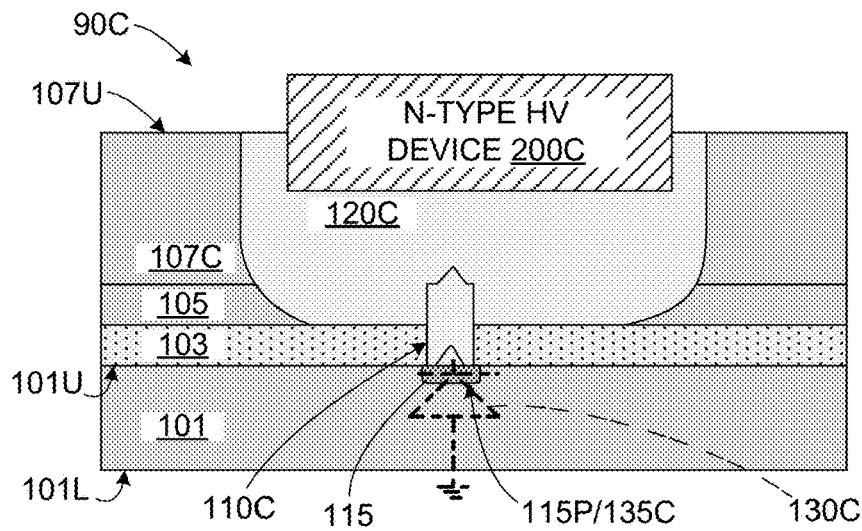

FIGS. 5A to 5C depict yet another exemplary embodiment in which a plug implant is utilized to form a P-N junction inside the handle layer.

FIG. 5A depicts an initial SOI substrate 100CI after an opening 202 is defined through top silicon layer 105 and insulator layer 103 in the manner described above with reference to FIG. 2B such that a portion 101U-1 of upper handle surface 101U is exposed. According to the present embodiment, a plug implant 115C is then formed in a corresponding portion of handle layer 101 by directing an N-type plug implant dopant 510 through opening 202 and exposed upper surface portion 101U-1 (e.g., using the same mask 201 that was utilized to define opening 202). Note that the additional N-type implant depicted in FIG. 5A is performed after the formation of opening 202 through insulator layer 103 and top silicon layer 105, but before the formation of a polysilicon/silicon plug in opening 202.

FIG. 5B depicts the subsequently formed SOI substrate 100C after polysilicon/silicon plug 110C is formed in the opening and device layer 107C is formed over polysilicon/silicon plug 110C and top silicon layer 105 in the manner described above with reference to FIGS. 2C and 2D, and during formation of N-type well region 120C by way of implanting an N-type well dopant 209C through upper device layer surface 107U using mask 207 in a manner similar to that described above with reference to FIG. 4A, where the implant parameters are set such that a portion of N-type well dopant 209C diffuses entirely through polysilicon/silicon plug 110C to upper surface portion 101U-1 of handle layer 101, thereby providing an N-type conductive path between the subsequently formed HV device and a peripheral boundary 115P of plug implant 115C.

FIG. 5C depicts a completed SOI IC 90C after an HV device 200C is formed in and over well region 120C, and after a ground potential is applied to lower surface 101L of handle layer 101 in the manner described above with reference to FIG. 2F. With this configuration, a P-N junction diode 130C is formed by way of P-N interface 135C located at peripheral boundary 115P of plug implant 115C (i.e., inside handle layer 101), whereby P-N junction diode 130C is coupled between HV device 200C and lower surface 101L of handle layer 101 by way of polysilicon/silicon plug 110C and handle layer 101.

Figure 6A:
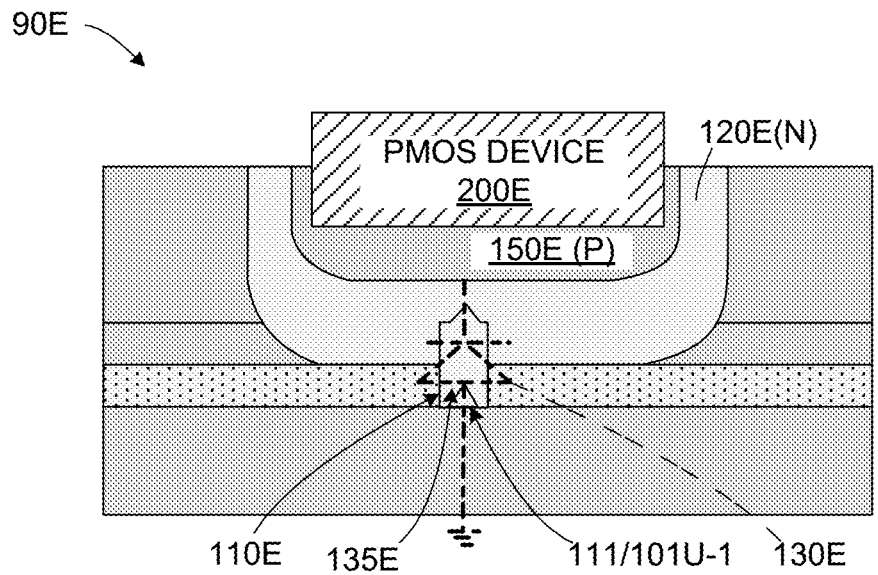
FIGS. 6A and 6B are cross-sectional side views showing alternative SOI ICs including PMOS HV devices having enhanced BV characteristics according to additional exemplary embodiments of the present invention.
Figure 6B:
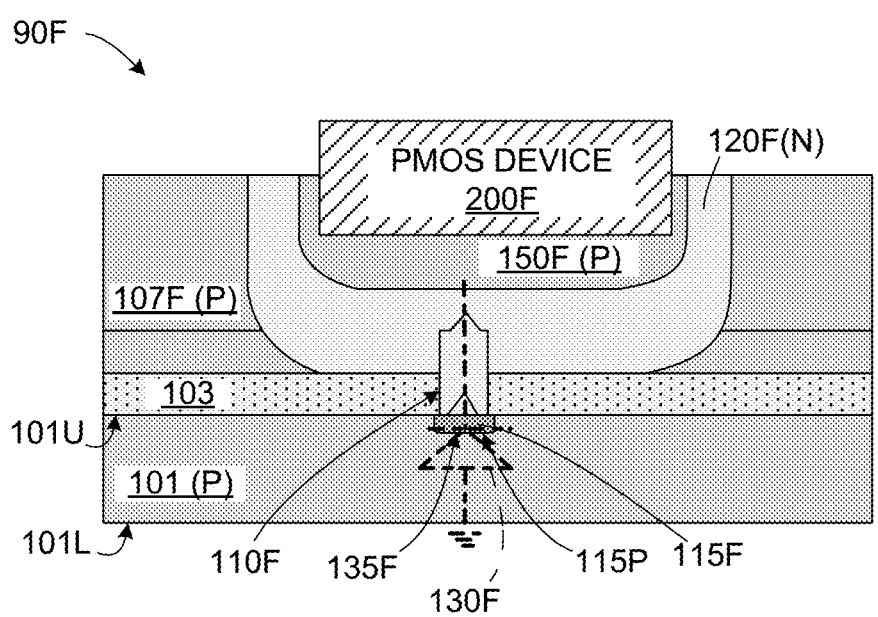

Although the present invention is described above with reference to SOI NMOS HV devices having enhanced BV characteristics, the novel characteristics of the present invention may be utilized to form SOI PMOS HV devices as well. For example, HV device 200 of FIG. 1 may be implemented as a PMOS transistor by way of utilizing an N-type SOI substrate (i.e., reversing the dopant species types mentioned above, e.g., such that the handle and device layer comprise N-doped silicon. Alternatively, as described below with reference to FIGS. 6A and 6B, an additional P-drift region may be utilized to facilitate the fabrication of a PMOS HV device in a P-type SOI substrate. For example, FIG. 6A depicts an SOI IC 90E formed on a P-type SOI substrate 100E (i.e., both handle layer 101 and device layer 107E are P-doped silicon), where SOI IC 90E includes a PMOS HV device 200E formed over a P-drift region 150E, which is formed using known techniques such that it is surrounded by an N-well region 120E in the manner described above, where PMOS HV device 200E is otherwise configured in the manner described above with reference to FIG. 3B (i.e., such that a P-N junction 135E formed inside polysilicon/silicon plug 110E produces a P-N junction diode 130E). FIG. 6B depicts a second exemplary embodiment in which an SOI IC 90F formed on a P-type SOI substrate includes a PMOS HV device 200F formed over a P-drift region 150F surrounded by an N-well region 120F, where PMOS HV device 200F is otherwise configured in the manner described above with reference to FIGS. 4B and 5C (i.e., such that a P-N junction diode 130F is produced in part by way of a P-N junction 135F formed at peripheral boundary 115P of a plug implant or diffusion region 115F in handle layer 101).

Figure 7:
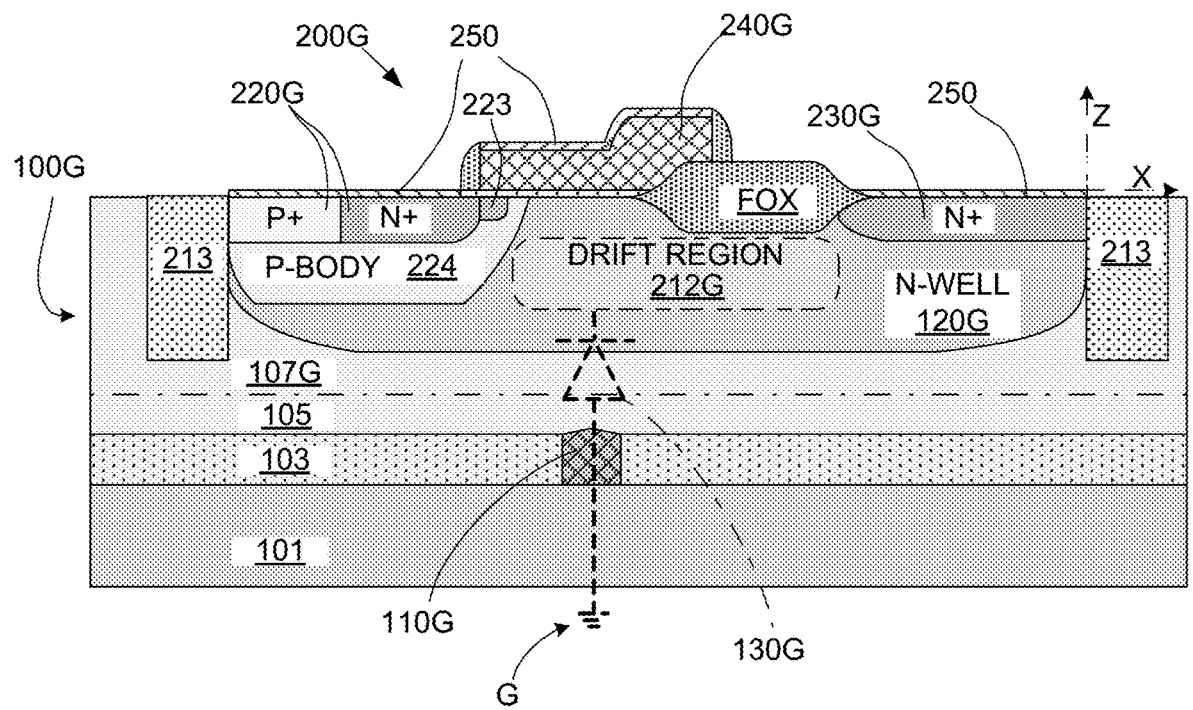
FIG. 7 is a cross-sectional side view showing an SOI IC including an exemplary LDMOS transistor having enhanced BV characteristics according to another embodiment of the present invention.

FIG. 7 shows a practical embodiment of the present invention including an LDMOS (SOI HV) device 200G fabricated on an SOI substrate 100G including an SiO2 insulation layer 103 sandwiched between a P-type handle layer 101 and a P-type top silicon layer 105, with P-type epitaxial silicon device layer 107G formed over top silicon layer 105 in the manner described above. In this case, N-well region 120G is formed between shallow-trench isolation (STI) structures 213 and is separated from a polysilicon/silicon plug 110G by a region of P-doped silicon in the manner described above with reference to FIG. 1, thereby forming a P-N junction diode 130G between N-well region 120G and an applied ground potential G. LDMOS device 200G includes a source region 220G including a P+ region and an N+ region formed in a P-body region 224, and includes a lightly-doped region 223 extending under a polysilicon gate structure 240G. Drain region 230G is formed by an N+ implant diffused into N-well region 120G on the opposite side of gate structure 240G. A first end of gate structure 240G is disposed on a gate oxide over region 223, and a thick oxide structure (e.g., a field oxide (FOX) structure, STI, stepped oxide, or local oxidation) is disposed between a second end of gate structure 240G and drain region 230G. A drift region 212G is formed below gate structure 240G and the field oxide structure between source region 220G and drain region 230G. Silicide 250 is formed over source region 220G, drain region 230G and gate structure 240G as indicated. Similar to the embodiment described above with reference to FIG. 1, LDMOS 200G is positioned on SOI substrate 100G such that polysilicon/silicon plug 110G is entirely disposed under drift region 212G.

Figure 8:
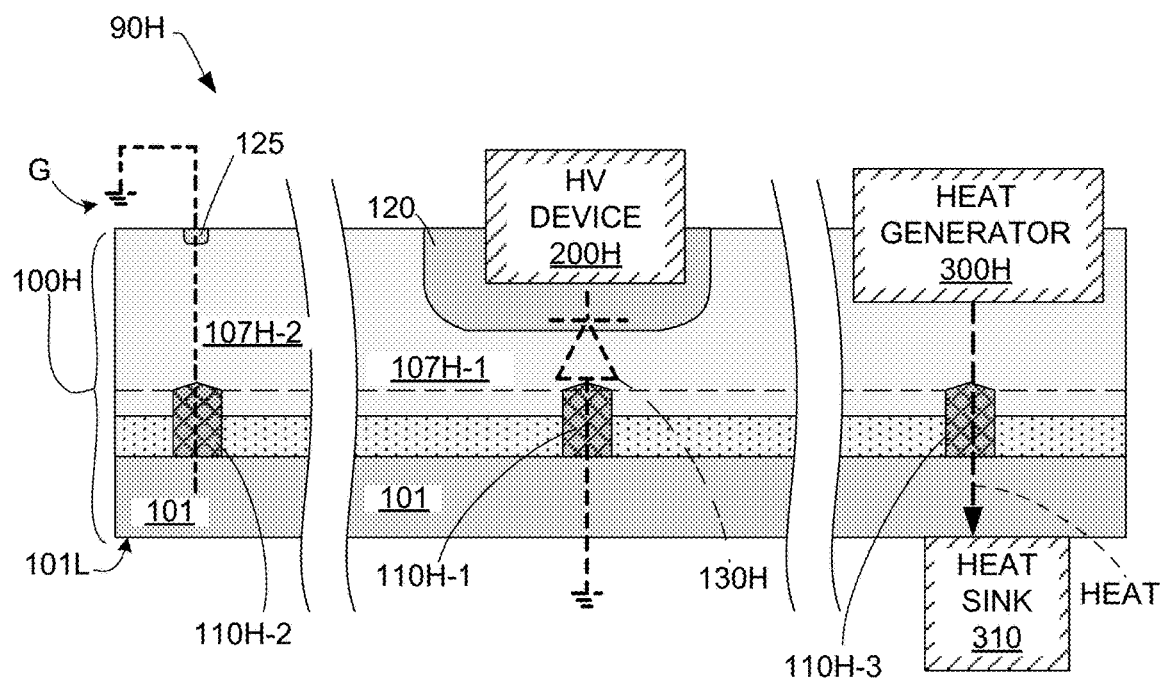
FIG. 8 is cross-sections showing an SOI IC including multiple polysilicon/silicon plugs utilized to perform various beneficial functions according to another embodiment of the present invention.

FIG. 8 depicts an SOI IC 90H that illustrates additional beneficial uses of the polysilicon/silicon plugs produced in accordance with the present invention. As indicated in the central portion of FIG. 8, a first polysilicon/silicon plugs 110H-1 provides a conductive path between a first device layer region 107H-1 and handle layer 101, thereby facilitating the formation of a P-N junction diode 130H that functions to enhance the BV of HV device 200H in the manner described above. In addition, polysilicon/silicon plug 110H-1 may serve as a gettering site for metal impurities that would otherwise reside in device layer portion 107H-1, and would degrade performance of the IC. SOI IC 90H also includes a second polysilicon/silicon plug 110H-2 that forms a conductive path between a first device layer region 107H-1 and handle layer 101, whereby handle layer 101 may be grounded from the front side of IC 90H by way of a contact 125. A further polysilicon/silicon plug 110H-3 is disposed under a device layer portion 107H-3 containing a high-heat-generating device 300, whereby polysilicon/silicon plug 110H-3 serves to dissipate heat H by serving as a thermal pathway from associated device layer portion 107H-3 to a heat sink 310 attached to lower surface 101L of handle layer 101. Because polysilicon/silicon plugs 110H-2 and 110H-3 may be formed simultaneously with polysilicon/silicon plug 110H-1, which is specifically provided to reduce the BV of HV device 200H in the manner described herein, the benefits provided by one or more of these additional polysilicon/silicon plugs are achieved with no additional production cost.

Although the present invention has been described with respect to certain specific embodiments, it will be clear to those skilled in the art that the inventive features of the present invention are applicable to other embodiments as well, all of which are intended to fall within the scope of the present invention.

The invention claimed is:

1. A method for fabricating a high voltage (HV) device on a Silicon-On-Insulator (SOI) substrate, the SOI substrate including an insulation layer sandwiched between a handle layer and a top silicon layer, wherein both the handle layer and the top silicon layer have a first doping species type, the method comprising:

defining an opening through the top silicon layer and the insulator layer such that an upper surface portion of the handle layer is exposed in said opening;

forming a device layer by growing epitaxial silicon having said first doping species type such that at least one of polycrystalline silicon and monocrystalline silicon of said epitaxial silicon forms a polysilicon/silicon plug in said opening while said epitaxial silicon forms on an upper surface of the top silicon layer and over the opening, and such that a subsequently grown portion of said epitaxial silicon covering said polysilicon/silicon plug forms said device layer;

forming a well region in the device layer over said polysilicon/silicon plug by implanting a well dopant having a second dopant species type into a corresponding portion of said device layer, and forming at least a portion of said HV device in said well region such that said HV device is disposed over said polysilicon/silicon plug, wherein said handle layer, said polysilicon/silicon plug and said well region are configured to form a P-N junction diode coupled between said HV device and a lower surface of said handle layer.

2. The method of claim 1, wherein forming said well region comprises implanting said well dopant such that a lower boundary of said well region is disposed between an upper surface and a lower surface of said device layer, whereby a P-N interface of said P-N junction diode is disposed in said device layer.

3. The method of claim 1, wherein forming said well region comprises implanting said well dopant such that said well region extends entirely between an upper surface of said device layer and an upper surface of the insulator layer, whereby a P-N interface of said P-N junction diode is located between an upper end surface of said polysilicon/silicon plug and said lower surface of said handle layer.

4. The method of claim 3, wherein forming said well region comprises implanting said well dopant such that said portion of said well dopant diffuses entirely through said polysilicon/silicon plug and into a diffusion region of said handle layer, whereby a P-N interface of said P-N junction diode is located between a lower end surface of said polysilicon/silicon plug and said lower surface of said handle layer.

5. The method of claim 1, further comprising, after defining said opening through the top silicon layer and the insulator layer and before forming said device layer, forming a plug implant in a portion of said handle layer by directing a plug implant dopant of said second doping species type through said opening and said exposed upper surface portion of the handle layer, wherein forming said well region comprises implanting said well dopant such that said well region extends entirely between an upper surface of said device layer and an upper surface of the insulator layer, and such that a portion of said well dopant diffuses entirely through said polysilicon/silicon plug to said upper surface portion of the handle layer such that a conductive path is formed between said well region and said plug implant, whereby a P-N interface of said P-N junction diode is located at a peripheral boundary of said plug implant inside said handle layer.

6. The method of claim 1, wherein the first doping species type comprises one or more P-type dopants such that said handle layer, said top silicon layer and said device layer comprise P-doped silicon, wherein said second dopant species type comprises one or more N-type dopants such that said well region comprises N-doped silicon, and wherein forming said HV device comprises forming an NMOS transistor in said N-type well region.

7. The method of claim 1, wherein the first doping species type comprises one or more P-type dopants such that said handle layer, said top silicon layer and said device layer comprise P-doped silicon, wherein said second dopant species type comprises one or more N-type dopants such that said well region comprises N-doped silicon, wherein the method further comprises forming a P-drift region inside said N-type well region, and wherein forming said HV device comprises forming at least a portion of a PMOS transistor in said P-drift region.

8. The method of claim 1, wherein the first doping species type comprises one or more N-type dopants such that said handle layer, said top silicon layer and said device layer comprise N-doped silicon, wherein said second dopant species type comprises one or more P-type dopants such that said well region comprises P-doped silicon, and wherein forming said HV device comprises forming a PMOS transistor in and over said P-doped silicon of said well region.

9. The method of claim 1, wherein forming said HV device comprises forming a first region and a second region on said upper surface of said device layer such that said first region and said second region are laterally disposed on opposite sides of said polysilicon/silicon plug, and such that said polysilicon/silicon plug is entirely disposed under a drift region extending between said first region and said second region of said HV device.

10. The method of claim 9, wherein said HV device comprises an LDMOS device.

11. A method for fabricating a high voltage (HV) device on a Silicon-On-Insulator (SOI) substrate, the SOI substrate including an insulation layer sandwiched between a handle layer and a top silicon layer, wherein both the handle layer and the top silicon layer have a first doping species type, the method comprising:

defining an opening through the top silicon layer and the insulator layer such that an upper surface portion of the handle layer is exposed in said opening;

forming a plug implant in a portion of said handle layer by directing a plug implant dopant of a second doping species type through said opening and said exposed upper surface portion of the handle layer;

forming a device layer by growing epitaxial silicon having said first doping species type such that at least one of polycrystalline silicon and monocrystalline silicon of said epitaxial silicon forms a polysilicon/silicon plug in said opening while said epitaxial silicon forms on an upper surface of the top silicon layer and over the opening, and such that a subsequently grown portion of said epitaxial silicon covering said polysilicon/silicon plug forms said device layer;

forming a well region in the device layer over said polysilicon/silicon plug by implanting a dopant having said second dopant species type into a corresponding portion of said device layer such that said well region extends entirely between an upper surface of said device layer and an upper surface of the insulator layer, and a portion of said well dopant diffuses entirely through said polysilicon/silicon plug to said plug implant, and forming at least a portion of said HV device in said well region.

* * * * *